(12) United States Patent
Ikeo et al.

(10) Patent No.: US 12,431,326 B2
(45) Date of Patent: Sep. 30, 2025

(54) CHARGED PARTICLE BEAM DEVICE AND IMAGE ACQUISITION METHOD

(71) Applicant: JEOL Ltd., Tokyo (JP)

(72) Inventors: Nobuyuki Ikeo, Tokyo (JP); Kenichi Tsutsumi, Tokyo (JP)

(73) Assignee: JEOL Ltd., Tokyo (JP)

( * ) Notice: Subject to any disclaimer, the term of this patent is extended or adjusted under 35 U.S.C. 154(b) by 358 days.

(21) Appl. No.: 18/208,598

(22) Filed: Jun. 12, 2023

(65) Prior Publication Data

US 2023/0402252 A1 Dec. 14, 2023

(30) Foreign Application Priority Data

Jun. 13, 2022 (JP) .................................. 2022-095078

(51) Int. Cl.
*H01J 37/22* (2006.01)
(52) U.S. Cl.
CPC ..... *H01J 37/222* (2013.01); *H01J 2237/2511* (2013.01); *H01J 2237/2804* (2013.01); *H01J 2237/2806* (2013.01)
(58) Field of Classification Search
USPC ................................................. 250/306, 307
See application file for complete search history.

(56) References Cited

U.S. PATENT DOCUMENTS

| 6,448,555 | B1 | 9/2002 | Hosokawa | |
| 2003/0111602 | A1* | 6/2003 | Sato | H01J 37/222 250/307 |
| 2003/0141451 | A1 | 7/2003 | Sato et al. | |
| 2007/0029478 | A1* | 2/2007 | Sato | H01J 37/28 250/310 |
| 2012/0267528 | A1 | 10/2012 | Sakai et al. | |

(Continued)

FOREIGN PATENT DOCUMENTS

| JP | H05290787 A | 11/1993 |
| JP | 2000348172 A | 12/2000 |
| JP | 2002148215 A | 5/2002 |

(Continued)

OTHER PUBLICATIONS

Office Action issued in JP2022-095078 on Aug. 6, 2024.

(Continued)

*Primary Examiner* — Kiet T Nguyen
(74) *Attorney, Agent, or Firm* — The Webb Law Firm

(57) ABSTRACT

A charged particle beam device acquires an image by scanning a specimen with a probe formed from a charged particle beam and detects a signal emitted from the specimen. The charged particle beam device includes an optical system that forms the probe; a control unit that repeatedly performs correction processing and image acquisition processing for acquiring a frame image; and an image processing unit that generates an image of the specimen based on a plurality of the frame images. In the correction processing, the control unit acquires a reference image, and corrects the shifting of the irradiation position of the probe. The image processing unit acquires position shift information, corrects a position shift between the frame images based on the position shift information, and generates an image of the specimen based on the plurality of corrected frame images.

9 Claims, 14 Drawing Sheets

(56) References Cited

U.S. PATENT DOCUMENTS

2016/0019696 A1    1/2016  Morita

FOREIGN PATENT DOCUMENTS

| JP | 2015210999 A  | 11/2015 |
| JP |  201776559 A  |  4/2017 |
| WO | 2011077644 A1 |  6/2011 |

OTHER PUBLICATIONS

Extended European Search Report issued in EP23178104.8 on Mar. 13, 2024.
European Search Report issued in EP23178104.8 on Nov. 7, 2023.

* cited by examiner

CHARGED PARTICLE BEAM DEVICE AND IMAGE ACQUISITION METHOD

CROSS-REFERENCE TO RELATED APPLICATION

This application claims priority to Japanese Patent Application No. 2022-095078 filed Jun. 13, 2022, the disclosure of which is hereby incorporated by reference in its entirety.

BACKGROUND OF THE INVENTION

Field of the Invention

The present invention relates to a charged particle beam device and an image acquisition method.

Description of Related Art

A scanning electron microscope (SEM), a scanning transmission electron microscope (STEM), an electron probe microanalyzer (EPMA), an Auger electron spectrometer (Auger), and so on are known as charged particle beam devices that acquire a scanned image by scanning a specimen with an electron probe.

In this type of charged particle beam device, a specimen may drift due to heat generated in the region of the specimen that is irradiated with the electron probe, temperature unevenness on the periphery thereof, and so on. Also, the irradiation position of the electron probe may drift due to temperature variation in the optical system and so on. When relative positions of the electron probe and the specimen change over time in this manner, it is impossible to acquire a scanned image with a high degree of positional accuracy. Therefore, in a charged particle beam device capable of observation and analysis at a high magnification of 100,000 times or more, a function for correcting the irradiation position of the electron probe is required.

JP-A-2000-348172, for example, discloses a method for detecting position shift between two images by determining a correlation function between the images from a product of Fourier transforms, wherein an inverse Fourier transform is performed by multiplying the real part of a Fourier component of a correlation by an integer smaller than 1 so that a correlation peak due to fixed noise becomes smaller than a peak representing a net position shift. Based on the position shift between the images, the irradiation position of an electron probe can be corrected.

Further, for example, JP-A-2015-210999 discloses a charged particle beam device that corrects the irradiation position of an electron probe by calculating a drift amount based on a cross-correlation function between a base image and a comparison image, and deflecting an electron beam based on the drift amount.

In a charged particle beam device, an image of a specimen can be acquired by repeatedly scanning an observation region of the specimen with an electron probe so as to acquire a plurality of frame images, and integrating the plurality of frame images. When an image of a specimen is acquired by integrating a plurality of frame images in this manner and the drift amount is large, position shift occurs between the frame images even if the position of the electron probe is corrected for each frame. When position shift occurs between the frame images, blurring occurs on the image of the specimen after the frame images are integrated.

SUMMARY OF THE INVENTION

According to a first aspect of the present disclosure, there is provided a charged particle beam device that acquires an image by scanning a specimen with a probe formed from a charged particle beam and detecting a signal emitted from the specimen, the charged particle beam device including:
  an optical system that forms the probe from the charged particle beam and scans the specimen using the probe;
  a control unit that repeatedly performs correction processing for correcting shifting of an irradiation position of the probe on the specimen and image acquisition processing for acquiring a frame image by causing the optical system to scan an observation region of the specimen using the probe; and
  an image processing unit that generates an image of the specimen based on a plurality of the frame images,
  in the correction processing, the control unit acquiring a reference image by causing the optical system to scan the observation region using the probe, and correcting the shifting of the irradiation position of the probe based on a position shift amount between a base image and the reference image, and
  the image processing unit acquiring position shift information relating to a position shift between the base image and the reference image, correcting a position shift between the frame images based on the position shift information, and generating the image of the specimen based on the plurality of corrected frame images.

According to a second aspect of the present disclosure, there is provided an image acquisition method employed in a charged particle beam device that acquires an image by scanning a specimen with a probe formed from a charged particle beam and detecting a signal emitted from the specimen, the image acquisition method including:
  a step for repeatedly performing a correction step for correcting shifting of an irradiation position of the probe on the specimen and an image acquisition step for acquiring a frame image by scanning an observation region of the specimen using the probe; and
  an image processing step for generating an image of the specimen based on a plurality of the frame images,
  in the correction step, a reference image being acquired by scanning the observation region using the probe, and the shifting of the irradiation position of the probe being corrected based on a position shift amount between a base image and the reference image, and
  in the image processing step, position shift information relating to a position shift between the base image and the reference image being acquired, a position shift between the frame images being corrected based on the position shift information, and the image of the specimen being generated based on the plurality of corrected frame images.

DESCRIPTION OF THE INVENTION

Figure 1:
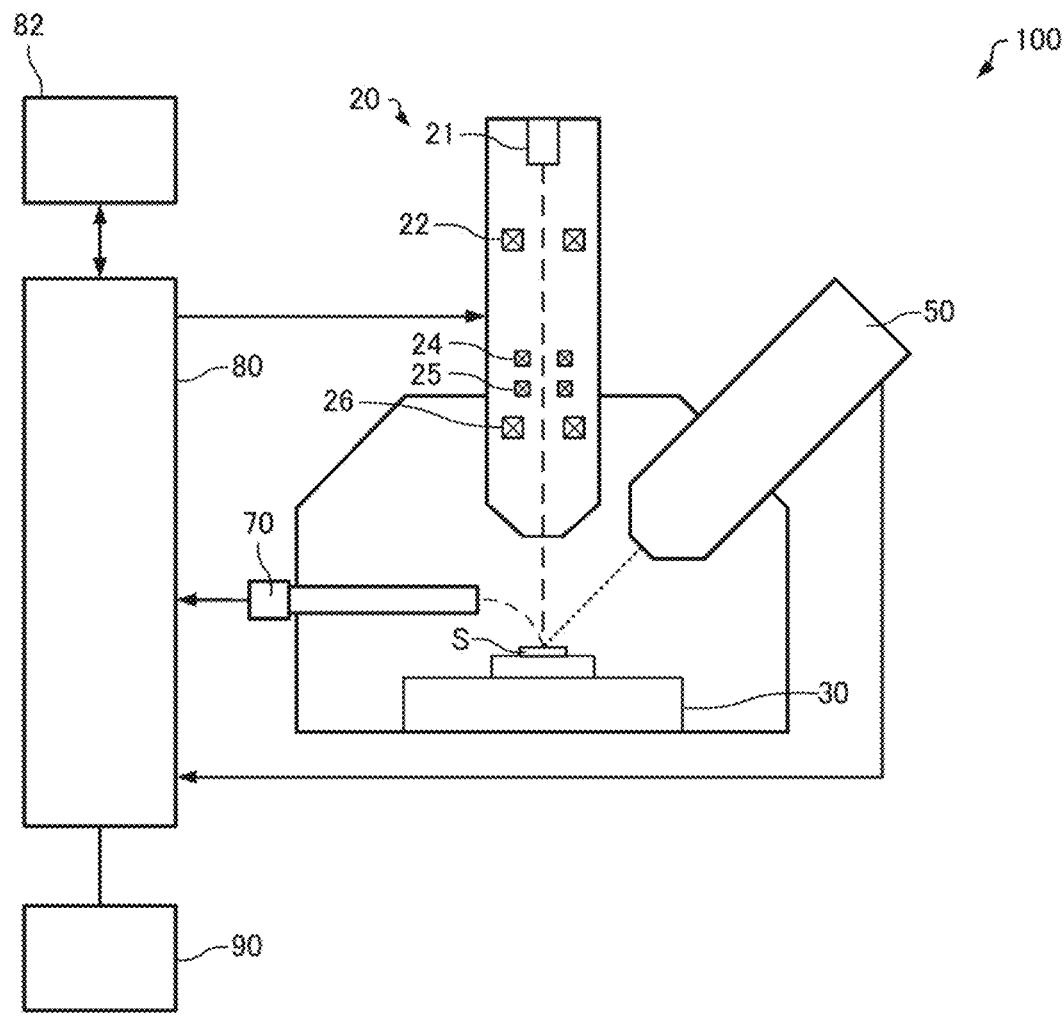
FIG. 1 is a diagram illustrating a configuration of an Auger electron spectrometer according to the first embodiment.

According to an embodiment of the present disclosure, there is provided a charged particle beam device that acquires an image by scanning a specimen with a probe formed from a charged particle beam and detecting a signal emitted from the specimen, the charged particle beam device including:

an optical system that forms the probe from the charged particle beam and scans the specimen using the probe;

a control unit that repeatedly performs correction processing for correcting shifting of an irradiation position of the probe on the specimen and image acquisition processing for acquiring a frame image by causing the optical system to scan an observation region of the specimen using the probe; and an image processing unit that generates an image of the specimen based on a plurality of the frame images, in the correction processing, the control unit acquiring a reference image by causing the optical system to scan the observation region using the probe, and correcting the shifting of the irradiation position of the probe based on a position shift amount between a base image and the reference image, and the image processing unit acquiring position shift information relating to a position shift between the base image and the reference image, correcting a position shift between the frame images based on the position shift information, and generating the image of the specimen based on the plurality of corrected frame images.

In this charged particle beam device, the position shift of each frame image is corrected as well as correcting the irradiation position of the probe, making it possible to correct position shift between the frame images, which cannot be corrected by correcting the irradiation position of the probe. Hence, with this charged particle beam device, image blurring caused by position shifting between the frame images can be reduced, and as a result, a clear image of the specimen can be acquired.

According to an embodiment of the present disclosure, there is provided an image acquisition method employed in a charged particle beam device that acquires an image by scanning a specimen with a probe formed from a charged particle beam and detecting a signal emitted from the specimen, the image acquisition method including:

a step for repeatedly performing a correction step for correcting shifting of an irradiation position of the probe on the specimen and an image acquisition step for acquiring a frame in age by scanning an observation region of the specimen using the probe; and an image processing step for generating an image of the specimen based on a plurality of the frame images, in the correction step, a reference image being acquired by scanning the observation region using the probe, and the shifting of the irradiation position of the probe being corrected based on a position shift amount between a base image and the reference image, and in the image processing step, position shift information relating to a position shift between the base image and the reference image being acquired, a position shift between the frame images being corrected based on the position shift information, and an image of the specimen being generated based on the plurality of corrected frame images.

In this image acquisition method, the position shift of each frame image is corrected as well as correcting the irradiation position of the probe, making it possible to correct position shift between the frame images, which cannot be corrected by correcting the irradiation position of the probe. Hence with this image acquisition method, image blurring caused by position shifting between the frame images can be reduced, and as a result, a clear image of the specimen can be acquired.

Preferred embodiments of the invention will now be described in detail with reference to the drawings. It is noted that the embodiments described below do not unduly limit the scope of the invention as stated in the claims. Further, all of the components described in the following embodiments are not necessarily essential requirements of the invention.

1. First Embodiment 1.1. Auger Electron Spectrometer

First, an Auger electron spectrometer according to the first embodiment will be described with reference to the figures. FIG. 1 is a diagram illustrating a configuration of an Auger electron spectrometer 100 according to the first embodiment.

The Auger electron spectrometer 100 performs measurements using Auger electron spectroscopy. Auger electron spectroscopy is a method for performing element analysis by measuring the energy of Auger electrons that are excited by an electron beam or the like and emitted from a specimen.

As illustrated in FIG. 1, the Auger electron spectrometer 100 includes an optical system 20, a specimen stage 30, an electron spectrometer 50, a secondary electron detector 70, a control unit 80, a storage unit 82, and an image processing unit 90.

The optical system 20 is an electron optical system that forms a probe using an electron beam and scans a specimen S with the probe. The optical system 20 includes an electron source 21, a condenser lens 22, a deflector 24, a scanning deflector 25, and an objective lens 26.

The electron source 21 emits the electron beam. For example, the electron source 21 is an electron gun that emits an electron beam by accelerating electrons emitted from a cathode using an acceleration voltage applied between the cathode and an anode.

The condenser lens 22 and the objective lens 26 form the electron probe by condensing the electron beam emitted from the electron source 21. The scanning deflector 25 two-dimensionally deflects the electron beam condensed by the condenser lens 22 and the objective lens 26. By deflecting the electron beam two-dimensionally using the scanning deflector 25, the specimen S can be scanned by the electron probe. The deflector 24 two-dimensionally deflects the condensed electron beam. The deflector 24 is used, for example, in image shifting for electromagnetically ng the field of view of the scanned image.

The specimen stage 30 holds the specimen S. The specimen stage 30 includes, for example, a horizontal direction moving mechanism for moving the specimen S in a horizontal direction, a height direction moving mechanism for moving the specimen S in a height direction, and a tilting mechanism for tilting the specimen S. The specimen stage 30 can be used to position the specimen S.

The electron spectrometer 50 analyzes the Auger electrons. The electron spectrometer 50 is a hemispherical electrostatic analyzer, for example. The electron spectrometer 50 includes an inner hemispherical electrode and an outer hemispherical electrode. The electron spectrometer 50 applies a voltage between the inner hemispherical electrode and the outer hemispherical electrode and thereby detects Auger electrons in an energy range corresponding to the applied voltage.

By counting the Auger electrons detected by the electron spectrometer 50 for each energy value, an Auger spectrum can be acquired. Moreover, by scanning the specimen S with the electron probe and measuring the number of Auger electrons (the strength of the Auger electrons) at each point on the specimen S, an Auger image can be acquired. The Auger image is an image showing the strength distribution of the Auger electrons on the specimen S.

The secondary electron detector 70 detects secondary electrons emitted from the specimen S when the specimen S is irradiated with the electron beam. By scanning the specimen S with the electron probe and measuring the number of secondary electrons (the strength of the secondary electrons) at each point on the specimen S, a secondary electron image can be acquired.

Although not shown in the figures, the Auger electron spectrometer 100 may also include a backscattered-electron detector that detects backscattered electrons emitted from the specimen S when the specimen S is irradiated with the electron beam. By scanning the specimen S with the electron probe and measuring the number of backscattered electrons at each point on the specimen S, a backscattered electron image can be acquired.

The control unit 80 controls the optical system 20. Further, the control unit 80 repeatedly performs correction processing for correcting shifting of the irradiation position of the electron probe on the specimen S and image acquisition processing for acquiring a frame image by causing the optical system 20 to scan an observation region of the specimen S using the electron probe. The processing performed by the control unit 80 will be described in detail below in "1.2.1. Processing of control unit".

The control unit 80 includes, for example, a processor such as a CPU (Central Processing Unit) or a DSP (Digital Signal Processor), and a storage device (a RAM (Random Access Memory), a ROM (Read Only Memory), and so on). Various types of calculation processing and various types of control processing are performed in the control unit 80 by executing a program stored in the storage device using the processor.

The storage unit 82 stores the images acquired by the control unit 80. The storage unit 82 includes, for example, a RAM, a hard disk, or the like.

The image processing unit 90 generates an image of the specimen S. The image processing unit 90 generates an image of the specimen S based on a plurality of frame images. The processing performed by the image processing unit 90 will be described in detail below in "1.2.2. Processing of image processing unit".

The image processing unit 90 includes, for example, a processor such as a CPU or a DSP, and a storage device such as a RAM or a ROM. Various types of calculation processing and various types of control processing are performed in the image processing unit 90 by executing a program stored in the storage device using the processor.

Figure 2:
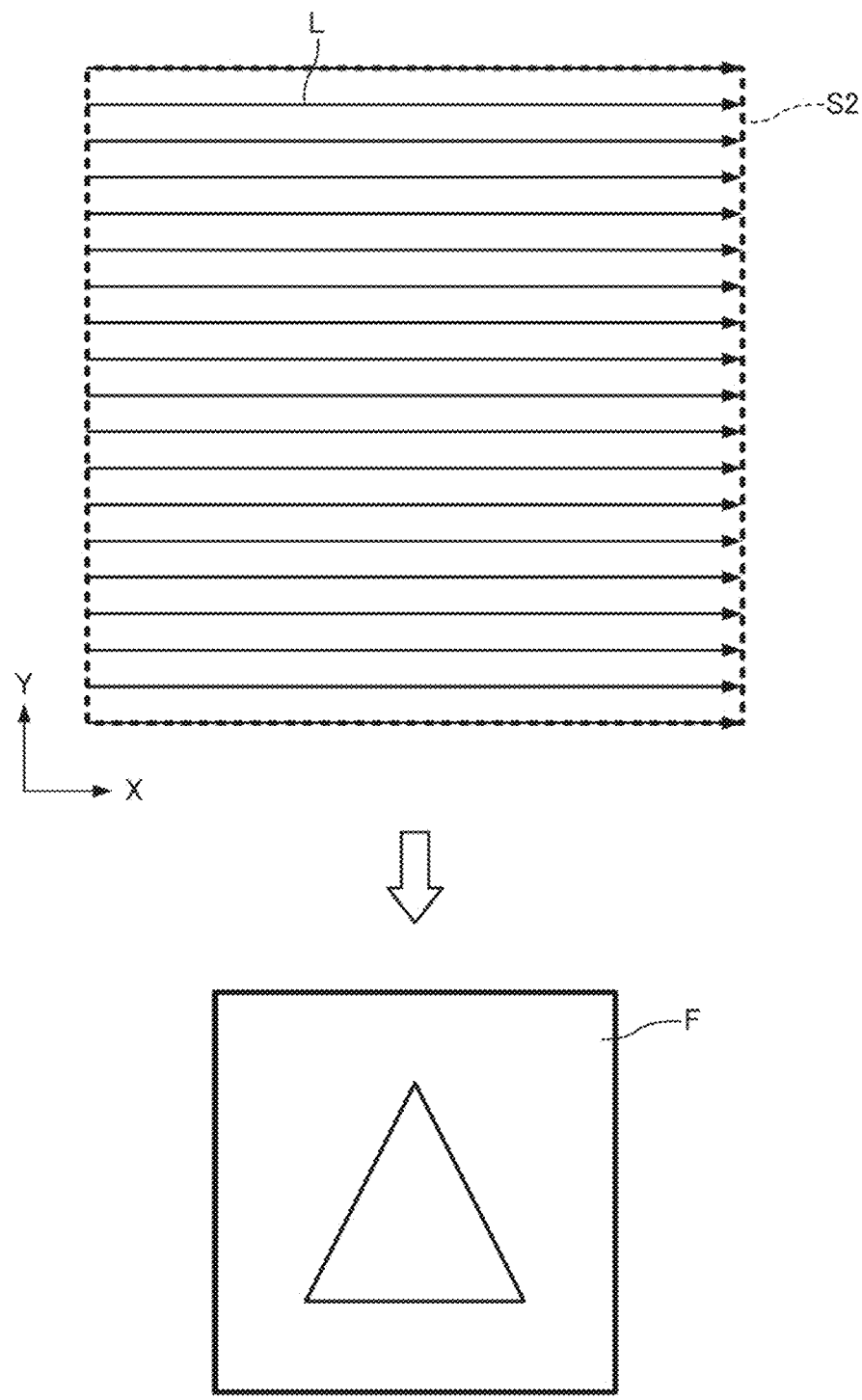
FIG. 2 is a diagram for describing scanning performed by an electron probe.

FIG. 2 is a diagram for describing scanning performed by the electron probe of the Auger electron spectrometer 100.

In the Auger electron spectrometer 100, the electron probe is formed by condensing the electrons emitted from the electron source 21 using the condenser lens 22 and the objective lens 26, whereupon the specimen S is scanned with the electron probe by deflecting the electron beam using the scanning deflector 25. By scanning the specimen S with the electron probe, analyzing the Auger electrons emitted from each point on the specimen S using the electron spectrometer 50, and detecting Auger electrons of specific energy values, an Auger image can be acquired. Furthermore, by scanning the specimen S with the electron probe and detecting the secondary electrons emitted from each point on the specimen S using the secondary electron detector 70, a secondary electron image can be acquired.

In the Auger electron spectrometer 100, as illustrated in FIG. 2, raster scanning is performed on an observation region S2 of the specimen S. For example, as illustrated in FIG. 2, a scan is performed using the electron probe by repeatedly drawing scanning lines L along the X axis and moving the position in which the scanning lines L are drawn along the Y axis. By scanning the observation region S2 with the electron probe once, a single frame image F can be acquired. In the Auger electron spectrometer 100, a plurality of frame images F are acquired by repeatedly scanning the observation region S2 with the electron probe, and a single image (an Auger image) of the specimen S is generated based on the plurality of frame images F. By generating the image of the specimen S based on the plurality of frame images F, damage to the specimen S caused by the electron beam can be reduced, and at the same time, an image with reduced noise can be acquired.

1.2. Operations

1.2.1. Processing of Control Unit

Figure 3:
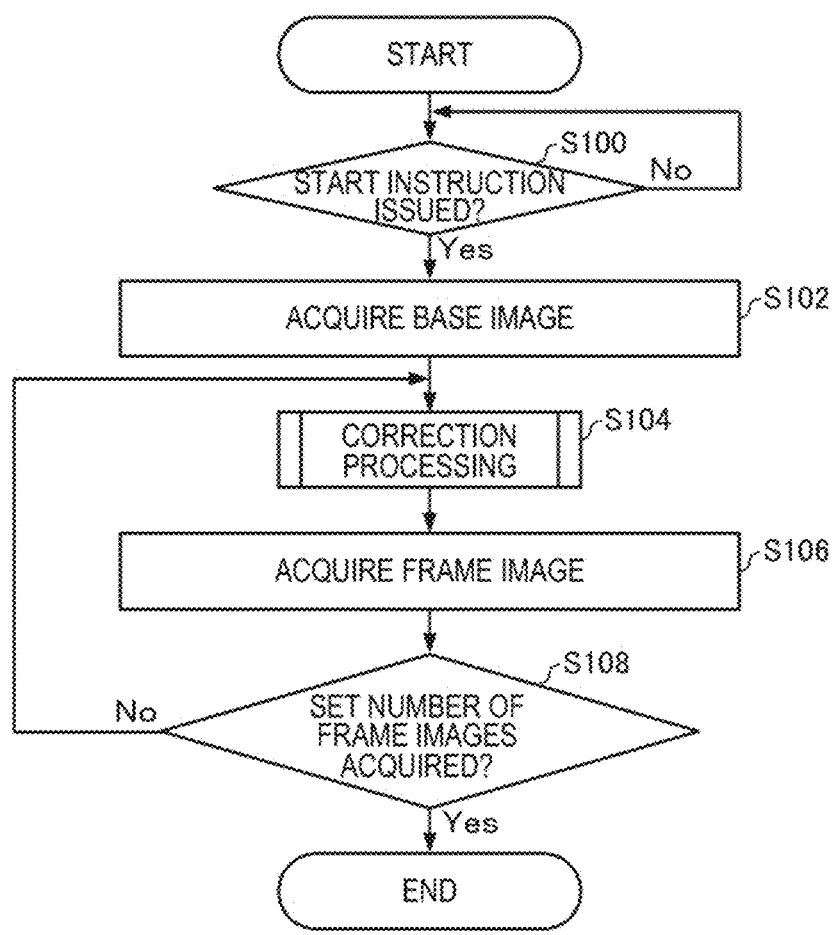
FIG. 3 is a flowchart illustrating an example of processing performed by a control unit of the Auger electron spectrometer according to the first embodiment.

FIG. 3 is a flowchart illustrating an example of the processing performed by the control unit 80 of the Auger electron spectrometer 100. Here, operations performed by the Auger electron spectrometer 100 when acquiring an Auger image will be described.

Before the control unit 80 executes processing for acquiring the Auger image, a user sets conditions (the acceleration voltage, the probe current, and so on) of the optical system 20 and conditions of the electron spectrometer 50 for acquiring the Auger image. The user sets these conditions by operating a setting unit (a user interface or the like) of the control unit 80. The settings of these conditions in the setting unit are reflected in the processing performed by the control unit 80.

Further, the user determines the observation region S2 on the specimen S. For example, the user observes the specimen S by acquiring a secondary electron image of the specimen S in the Auger electron spectrometer 100, and determines the observation region S2.

After determining the conditions of the optical system 20, the conditions of the electron spectrometer 50, and the observation region S2, the user instructs the Auger electron spectrometer 100 to stall acquiring an Auger image.

The control unit 80 determines whether or not the user has issued an instruction to start acquiring an Auger image (S100), The control unit 80 determines that the user has issued a start instruction when a depression operation has been performed on a start button or a start instruction has been input from an input device.

Having determined that the user has issued a start instruction (Yes in S100), the control unit 80 acquires a base image (S102).

The base image is an image that serves as a position reference of the Auger image. Here, the base image is a secondary electron image. For example, the control unit 80 causes the optical system 20 to scan the observation region S2 with the electron probe and acquires data of the base image (a secondary electron image) from the secondary electron detector 70. Note that the base image may be acquired after the observation region S2 has been determined and before the start, instruction has been issued.

Next, the control unit 80 performs correction processing for correcting shifting of the irradiation position of the electron probe on the specimen S (S104). The correction processing S104 will be described below.

Next, the control unit 80 performs image acquisition processing for acquiring the frame image F (S106).

As illustrated in FIG. 2, the control unit 80 acquires data of a frame image F of the Auger image by causing the optical system 20 to scan the observation region S2 with the electron probe. The frame image F of the Auger image is an Auger image acquired by scanning the observation region S2 once. The control unit 80 stores the frame image F in the storage unit 82.

Next, the control unit 80 determines whether or not a set number of frame images F has been acquired (S108).

The control unit 80 counts the frame images h stored in the storage unit 82 and determines whether or not a preset number of frame images F has been acquired.

Having determined that the set number of frame images F has not been acquired (No in S108), the control unit 80 performs the correction processing S104, the image acquisition processing S106, and the determination processing S108. The control unit 80 repeats the correction processing S104 and the image acquisition processing S106 until it is determined that the set number of frame images F has been acquired. The control unit 80 performs the correction processing S104 and the image acquisition processing S106 for each frame.

After determining that the set number of frame images F has been acquired (Yes in S108), the control unit 80 terminates the processing. Thus, the set number of frame images F can be acquired.

Note that here, a case in Which the image acquisition processing S106 is performed after the correction processing S104 was described, but the correction processing S104 may be performed after the image acquisition processing S106.

Figure 4:
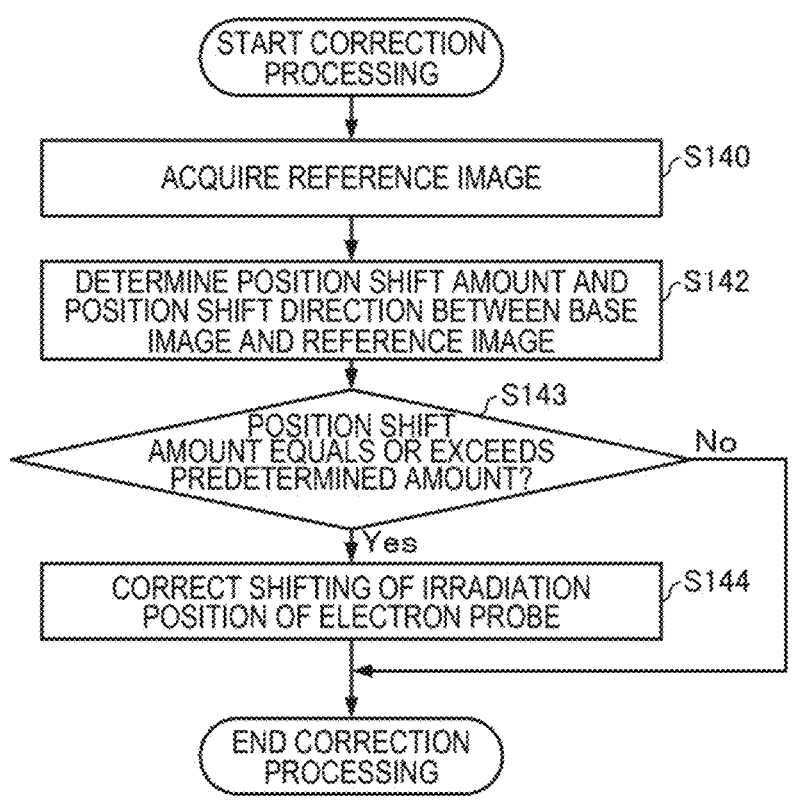
FIG. 4 is a flowchart illustrating an example of correction processing.

FIG. 4 is a flowchart illustrating an example of the correction processing S104.

First, the control unit 80 acquires a reference image by causing the optical system 20 to scan the observation region S2 with the electron probe (S140).

The reference image is a secondary electron image of the observation region S2. The control unit 80 acquires data of the reference image (a secondary electron image) from the secondary electron detector 70 by causing the optical system 20 to scan the observation region S2 with the electron probe. The control unit 80 records the secondary electron image acquired as the reference image in the storage unit 82.

The control unit 80 then determines a position shift amount and a position shift direction between the base image and the reference image (a secondary electron image) (S142).

The control unit 80 determines the position shift amount and the position shift direction between the base image and the reference image by pattern matching, for example. Alternatively, for example, the position shift amount and the position shift direction may be determined by performing Fourier transforms respectively on the base image and the reference image and calculating a correlation function between the result of the Fourier transform performed on the base image and the result of the Fourier transform performed on the reference image. Alternatively, the control unit 80 may determine the position shift amount and the position shift direction between the base image and the reference image using the method described in JP-A-2000-348172.

Next, the control unit 80 determines whether or not the position shift amount between the base image and the reference image equals or exceeds a predetermined amount (S143). The predetermined amount can be set by the user at any desired value.

Having determined that the position shift amount between the base image and the reference image equals or exceeds the predetermined amount (Yes in S143), the control unit 80 corrects shifting of the irradiation position of the electron probe on the specimen S by operating the optical system 20 based on the position shift amount and the position shift direction between the base image and the reference image (S144).

The control unit 80 operates the optical stem 20 based on the position shift amount and the position shift direction between the base image and the reference image so as to cancel of the irradiation position of the electron probe on the specimen S. For example, shifting of the irradiation position is corrected by deflecting the electron beam using the deflector 24 so as to move the irradiation position of the electron probe by the position shift amount in an opposite direction to the position shift direction. The scanning deflector 25 then performs a scan using the electron probe in a state where the position shift of the electron probe has been corrected by the deflector 24. Thus, a scan can be performed using the electron probe in a state where the irradiation position of the electron probe has been corrected.

After operating the optical system 20 so as to cancel shifting of the irradiation position of the electron probe, or after determining that the position shift amount between the base image and the reference image does not equal or exceed the predetermined amount (No in S143), the control unit 80 terminates the correction processing.

1.2.2. Processing of Image Processing Unit

The image processing unit 90 generates an image of the specimen S based on the plurality of frame images F acquired by repeatedly performing the image acquisition processing S106.

Figure 5:
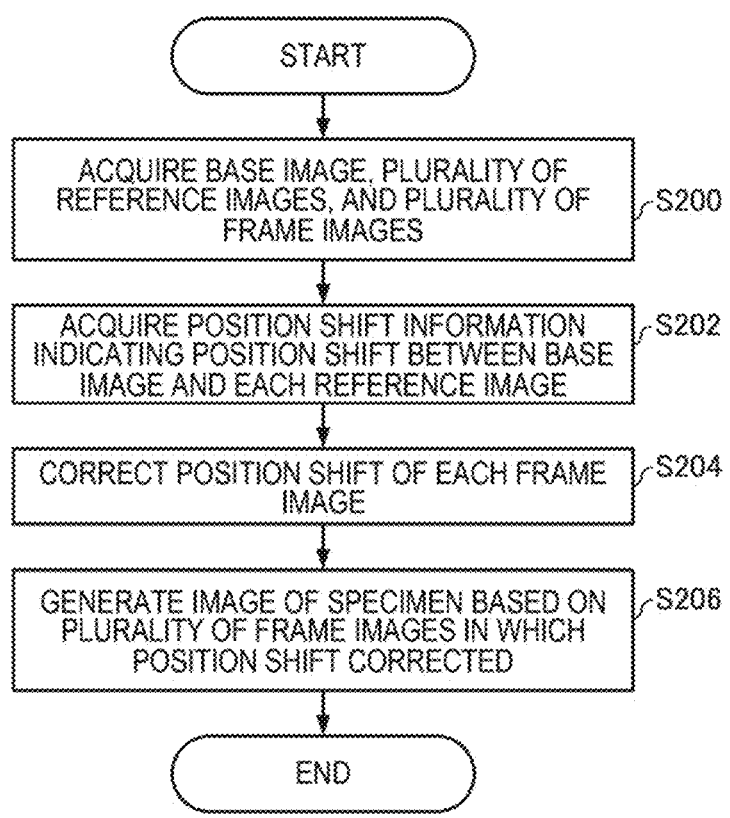
FIG. 5 is a flowchart illustrating an example of processing performed by an image processing unit of the Auger electron spectrometer according to the first embodiment.
Figure 6:
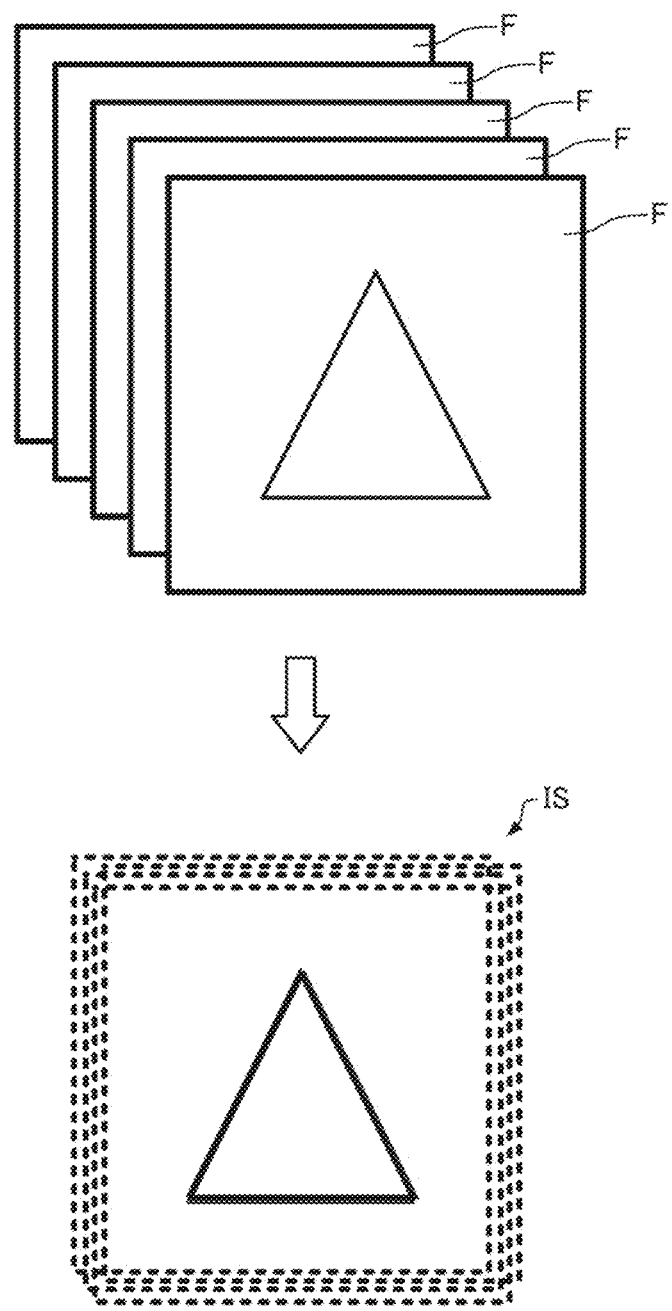
FIG. 6 is a diagram for describing processing performed by the image processing unit of the Auger electron spectrometer according to the first embodiment.

FIG. 5 is a flowchart illustrating an example of the processing performed by the image processing unit 90. FIG. 6 is a diagram for describing the processing performed by the image processing unit 90.

First, the image processing unit 90 acquires the base image, a plurality of reference images, and a plurality of frame images F by reading the base image, the plurality of reference images, and the plurality of frame images F recorded in the storage unit 82 (S200).

Next, the image processing unit 90 acquires position shift information indicating the position shift between the base image and each reference image (S202).

The image processing unit 90 then positions the reference image relative to the base image by performing a geometrical transformation, or more specifically an affine transformation (parallel movement, rotation, scaling, and so on), on the reference image based on the mutual information amount between the base image and the reference image. Thus, the image processing unit 90 acquires position shift information indicating the position shift between the base image and each reference image. The position shift information is information relating to the position shift between the base image and each reference image, and includes information such as the position shift amount, the position shift direction, rotation, scaling, and so on between the base image and each reference image.

Next, the image processing unit 90 corrects the position shift of each frame image F based on the position shift information indicating the position shift between the base image and each reference image (S204).

Since the correction processing S104 described above is performed for each frame, the reference image and the frame image F are acquired for each frame. Accordingly, the position shift of each frame image F is corrected based on the position shift information indicating the position shift between the base image and the reference image acquired in the same frame as the corresponding frame image F.

The image processing unit 90 moves the position (the coordinates) of each frame image F by the position shift amount in the opposite direction to the position shift direction between the base image and the corresponding reference image. For example, the image processing unit 90 moves the position (the coordinates) of the frame image F of a first frame by the position shift amount between the base image and the reference image of the first frame in the opposite direction to the position shift direction between the base image and the reference image of the first frame. Thus, the coordinates of each pixel constituting the frame image F of the first frame are modified by the position shift amount in the opposite direction to the position shift direction. Further, the image processing unit 90 corrects the rotation of the frame image F of the first frame based on the rotation between the base image and the reference image of the first frame. Furthermore, the image processing unit 90 enlarges or reduces the frame image F of the first frame based on the scaling factor between the base image and the reference image of the first frame. The image processing unit 90 then performs similar processing to that of the frame image F of the first frame on the frame images F of the second frame onward, and in so doing corrects the position shift of each frame image F.

Next, the image processing unit 90 generates an image IS (an Auger image) of the specimen S based on the plurality of frame images F in which the position shift has been corrected (S206).

As illustrated in FIG. 6, the image processing unit 90 superimposes the plurality of frame images F in which the position shift has been corrected, and averages or integrates the pixel values of the pixels having the same coordinates. Thus, the image IS (an Auger image) of the specimen S can be generated. The pixel values are values expressing the brightness of the pixels, and correspond to the number of Auger electrons (the strength of the Auger electrons). Here, the Auger image (the image IS) is a grayscale image, and the number of Auger electrons (the strength of the Auger electrons) is expressed by the brightness of each pixel.

1.3. Effects

In the Auger electron spectrometer 100, the control unit 80 repeatedly performs the correction processing S104 for correcting shifting of the irradiation position of the electron probe on the specimen S and the image acquisition processing S106 for acquiring the frame images F by causing the optical system 20 to scan the observation region S2 of the specimen S with the electron probe. Further, the image processing unit 90 generates the image IS of the specimen S based on the plurality of frame images F. Furthermore, in the correction processing S104, the control unit 80 acquires a reference image by causing the optical system 20 to scan the observation region S2 with the electron probe, and corrects shifting of the irradiation position of the electron probe based on the position shift amount between the base image and the reference image. Moreover, the image processing unit 90 corrects position shift between the frame images F based on the position shift information indicating the position shift between the base image and each reference image, and generates an image of the specimen S based on the plurality of corrected frame images F.

Hence, with the Auger electron spectrometer 100, the position shift of each frame image F is corrected as well as correcting the irradiation position of the electron probe, making it possible to correct position shift between the frame images F, which cannot be corrected by correcting the irradiation position of the electron probe. Accordingly, with the Auger electron spectrometer 100, image blurring caused by position shifting between the frame images F can be reduced, whereby a clear image IS of the specimen S can be acquired. As a result, the spatial resolution of the Auger image can be improved.

In the Auger electron spectrometer 100, the reference image is a secondary electron image, and the frame image F is an Auger image. With a secondary electron image, an image with little noise can be acquired in a shorter time than an Auger image. Therefore, by using a secondary electron image as the reference image, the correction processing S104 can be performed accurately in a short amount of time.

1.4. Modified Examples

In the first, embodiment, described above, the control unit 80 acquires a secondary electron image as the reference image in the correction processing S104, and acquires an Auger image as the frame image F in the image acquisition processing S106.

Instead, the control unit 80 may acquire the reference image simultaneously with the Auger image. In the Auger electron spectrometer 100, as illustrated in FIG. 1, both the electron spectrometer 50 for detecting Auger electrons and the secondary electron detector 70 are provided, and therefore Auger electrons and secondary electrons can be detected simultaneously. Hence, by detecting Auger elections using the electron spectrometer 50 and detecting secondary electrons using the secondary electron detector 70 during a single scan of the observation region S2, an Auger image (a frame image) and a reference image can be acquired simultaneously.

2. Second Embodiment 2.1. Auger Electron Spectrometer

Figure 7:
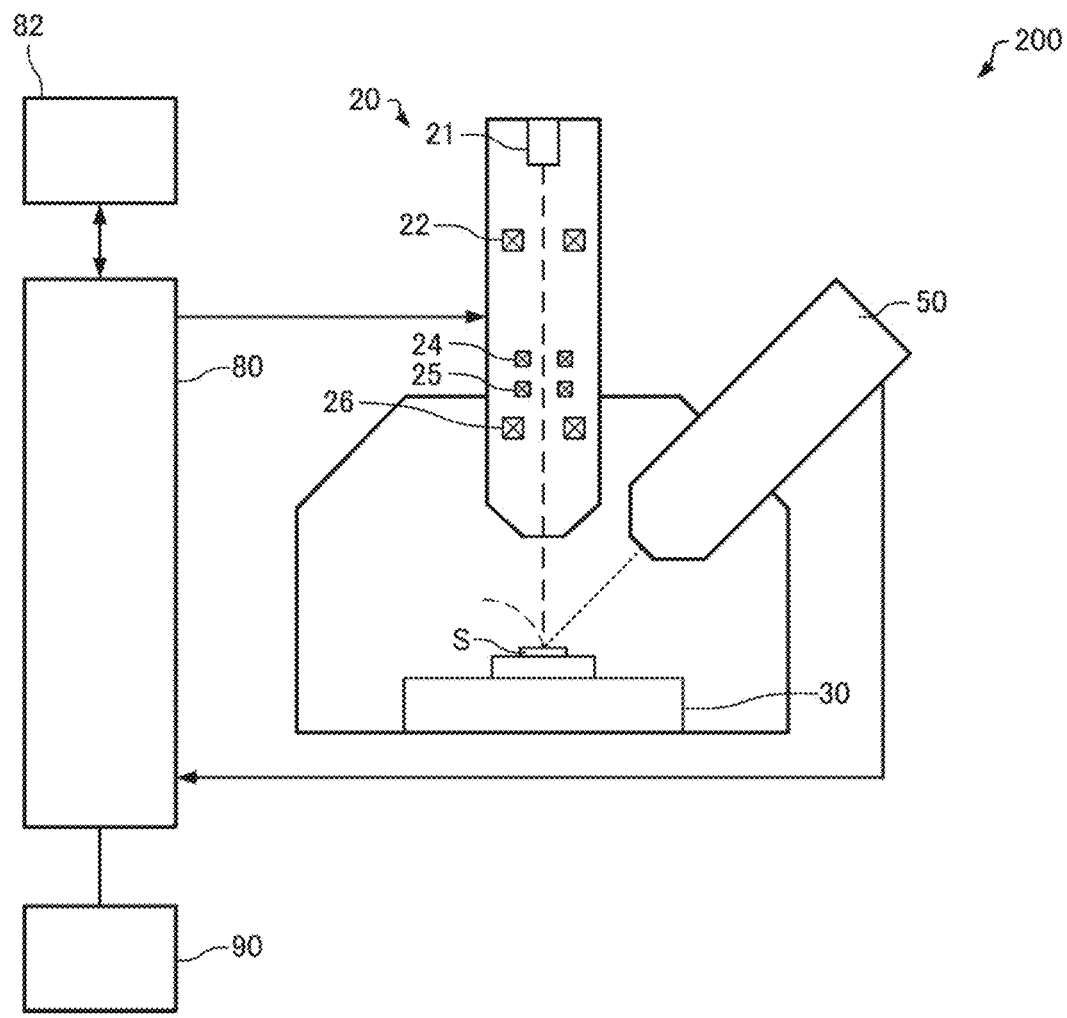
FIG. 7 is a diagram illustrating a configuration of an Auger electron spectrometer according to the second embodiment.

Next, an Auger electron spectrometer according to the second embodiment will be described with reference to the figures. FIG. 7 is a diagram illustrating a configuration of an Auger electron spectrometer 200 according to the second embodiment. Below, members of the Auger electron spectrometer 200 according to the second embodiment that have similar functions to the constituent members of the Auger electron spectrometer 100 according to the first embodiment have been allocated identical reference numerals, and detailed description thereof has been omitted.

The Auger electron spectrometer 100 described above, as illustrated in FIG. 1, includes the electron spectrometer 50 and the secondary electron detector 70. In the Auger electron spectrometer 200, on the other hand, as illustrated in FIG. 7, a secondary electron detector is not provided.

2.2. Operations 2.2.1. Processing of Control Unit

In the Auger electron spectrometer 100 described above, the base image and the reference image are secondary electron images, and the frame image F is an Auger image. In the Auger electron spectrometer 200, on the other hand, the base image, the reference image, and the frame image F are Auger images.

Figure 8:
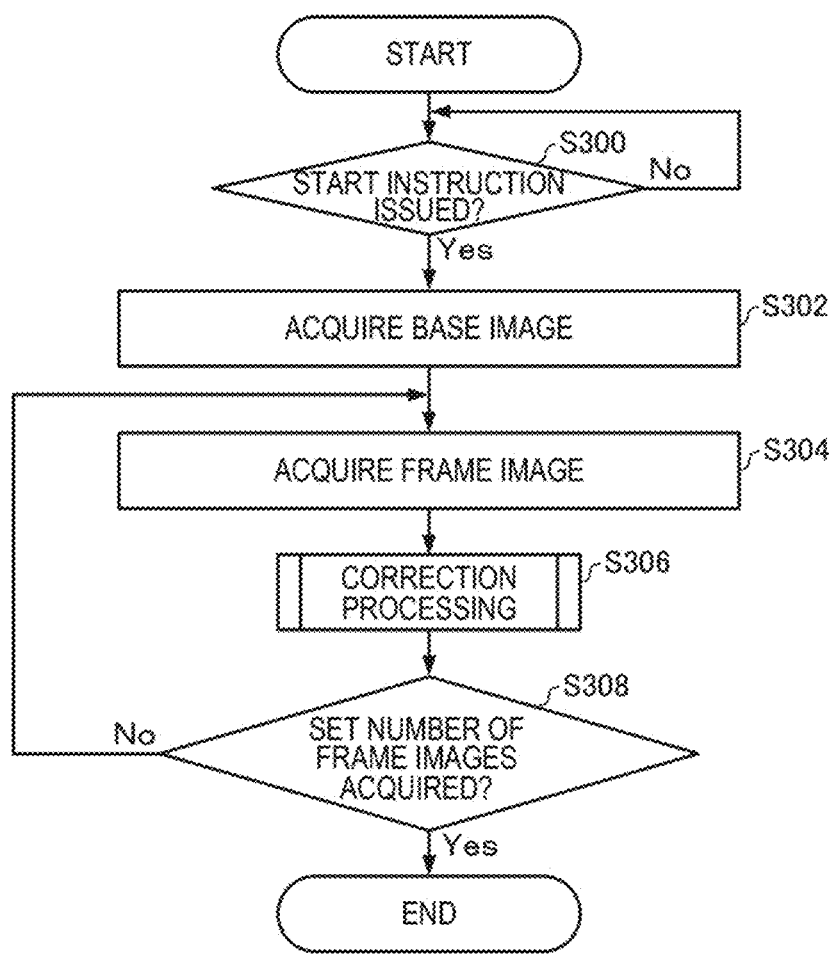
FIG. 8 is a flowchart illustrating an example of processing performed by a control unit of the Auger electron spectrometer according to the second embodiment.

FIG. 8 is a flowchart illustrating an example of the processing performed by the control unit 80 of the Auger electron spectrometer 200. Below, points that differ from the example of the Auger electron spectrometer 100 illustrated in FIG. 3 will be described, while description of similar points will be omitted.

The control unit 80 determines whether or not the user has issued an instruction to start acquiring an Auger image (S300).

Next, having determined that the user has issued a start instruction (Yes in S300), the control unit 80 acquires the base image (S302).

The control unit 80 acquires an Auger image as the base image. More specifically, the control unit 80 causes the optical system 20 to scan the observation region S2 with the electron probe, and acquires data of the Auger image from the electron spectrometer 50. Note that the Auger image acquired as the base image is also used as the frame image F of the first frame.

Next, the control unit 80 performs image acquisition processing for acquiring the frame image F (S304). The image acquisition processing S304 is performed in a similar manner to the image acquisition processing S106 described above. Here, the fame image F of the second frame is acquired.

Next, the control unit 80 performs correction processing for correcting shifting of the irradiation position of the electron probe on the specimen S (S306).

The correction processing S306 is performed in a similar manner to the correction processing S104 illustrated in FIG. 4 except that the Auger image of the first frame, acquired in the processing of S302, is used as the base image, and the Auger image of the second frame is used as the reference image.

Next, the control unit 80 determines whether or not the set number of frame images F has been acquired (S308). The determination processing S308 is performed in a similar manner to the determination processing S108 described above.

Having determined that the set number of frame images F has not been acquired (No in S308), the control unit 80 performs the image acquisition processing S304, the correction processing S306, and the determination processing S308. In the correction processing S306, the Auger image of the first frame, acquired in the processing of S302, is used as the base image, and an Auger image of a third frame, acquired in the image acquisition processing S304, is used as the reference image.

The control unit 80 repeats the image acquisition processing S304, the correction processing S306, and the determination processing S308 until it is determined that the set number of frame images F has been acquired. Thus, the control unit 80 performs the image acquisition processing S304 and the correction processing S306 for each frame.

After determining that the set number of frame images F has been acquired (Yes in S308), the control unit 80 terminates the processing. Thus, the set number of frame images F can be acquired.

Figure 9:
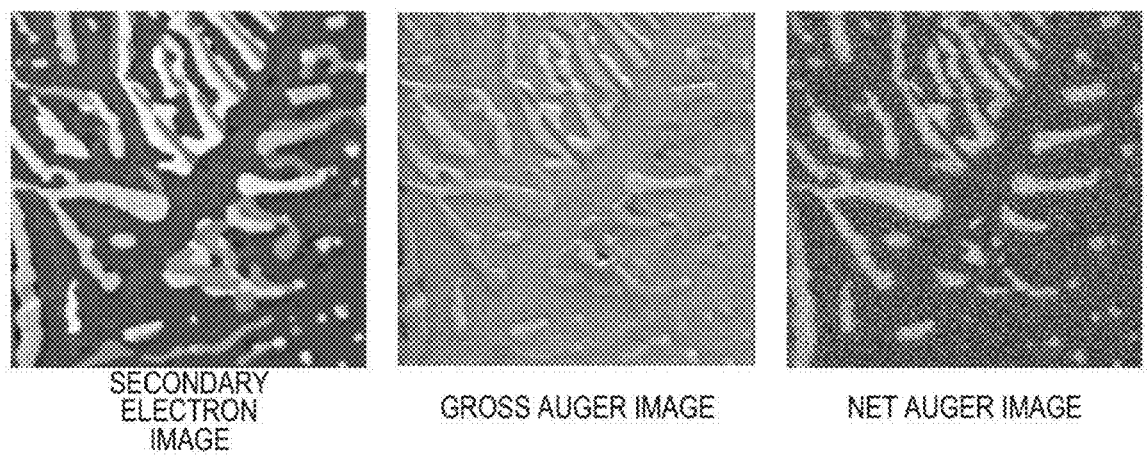
FIG. 9 illustrates a secondary electron image of lead-free solder, a gross Auger image of lead-free solder, and a net Auger image of lead-free solder.

FIG. 9 illustrates a secondary electron image of lead-free solder, a gross Auger image of lead-free solder, and a net Auger image of lead-free solder. The gross Auger image is an image showing the strength distribution in a peak position of an Auger spectrum. The net Auger image is obtained by subtracting the strength in a background position from the strength in the peak position of the Auger spectrum.

As illustrated in FIG. 9, the gross Auger image has a large S/N ratio (signal to noise ratio) and therefore resembles a secondary electron image. Accordingly, the gross Auger image is suitable as the base image and the reference image.

2.2.2. Processing of Image Processing Unit

Except for the fact that Auger images are used as the base image and the reference image, the processing of the image processing unit 90 of the Auger electron spectrometer 200 is similar to the processing of the image processing unit 90 of the Auger electron spectrometer 100 illustrated in FIG. 5, and therefore description thereof has been omitted.

2.3. Effects

In the Auger electron spectrometer 200, the reference image and the frame age F are Auger images. Hence, in the Auger electron spectrometer 200, the reference image and the frame image are the same, and therefore it is not necessary to acquire a secondary electron image as the reference image, for example. As a result, the plurality of frame images F can be acquired in a short amount of time.

3. Third Embodiment 3.1. Auger Electron Spectrometer

An Auger electron spectrometer according to the third embodiment is configured similarly to the Auger electron spectrometer 100 illustrated in FIG. 1, and therefore description thereof has been omitted.

3.2. Operations 3.2.1. Processing of Control Unit

In the Auger electron spectrometer 100 described above, the control unit 80 performed the correction processing S104 for each frame, whereas in the Auger electron spectrometer according to the third embodiment, the control unit 80 performs the correction processing for each 1/N (where N is an integer of 2 or more) of a frame.

Figure 10:
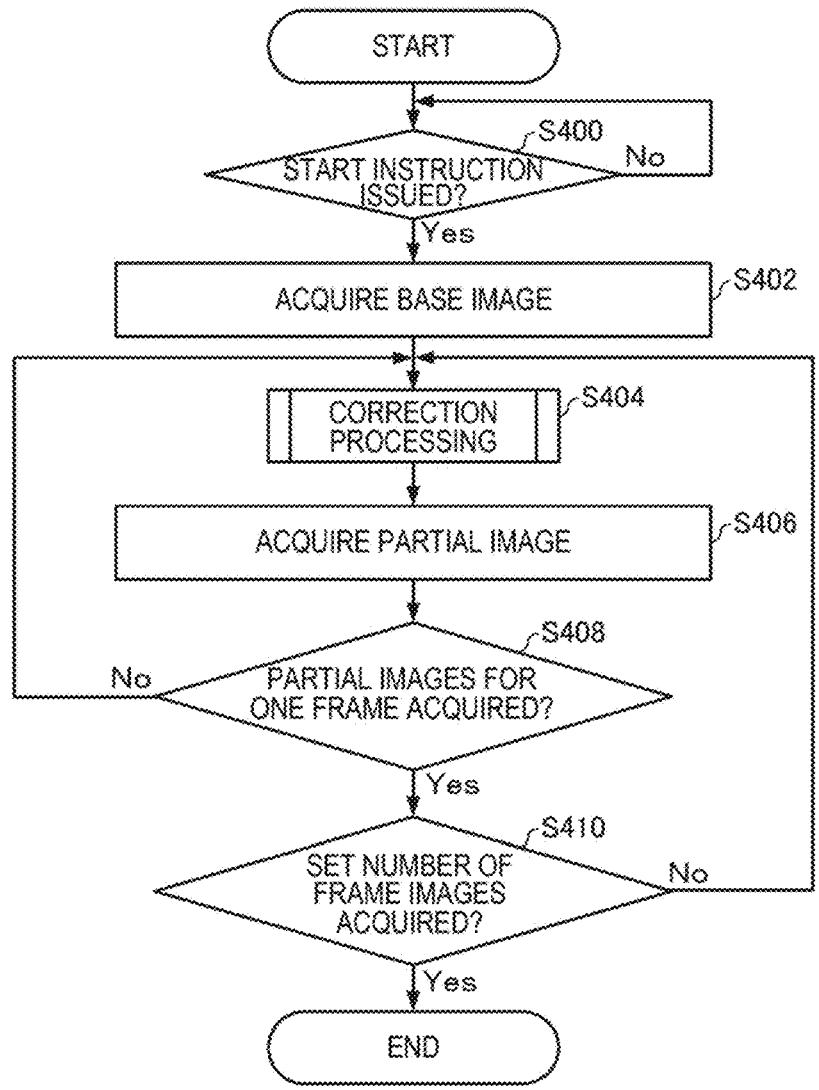
FIG. 10 is a flowchart illustrating an example of processing performed by a control unit of an Auger electron spectrometer according to the third embodiment.
Figure 11:
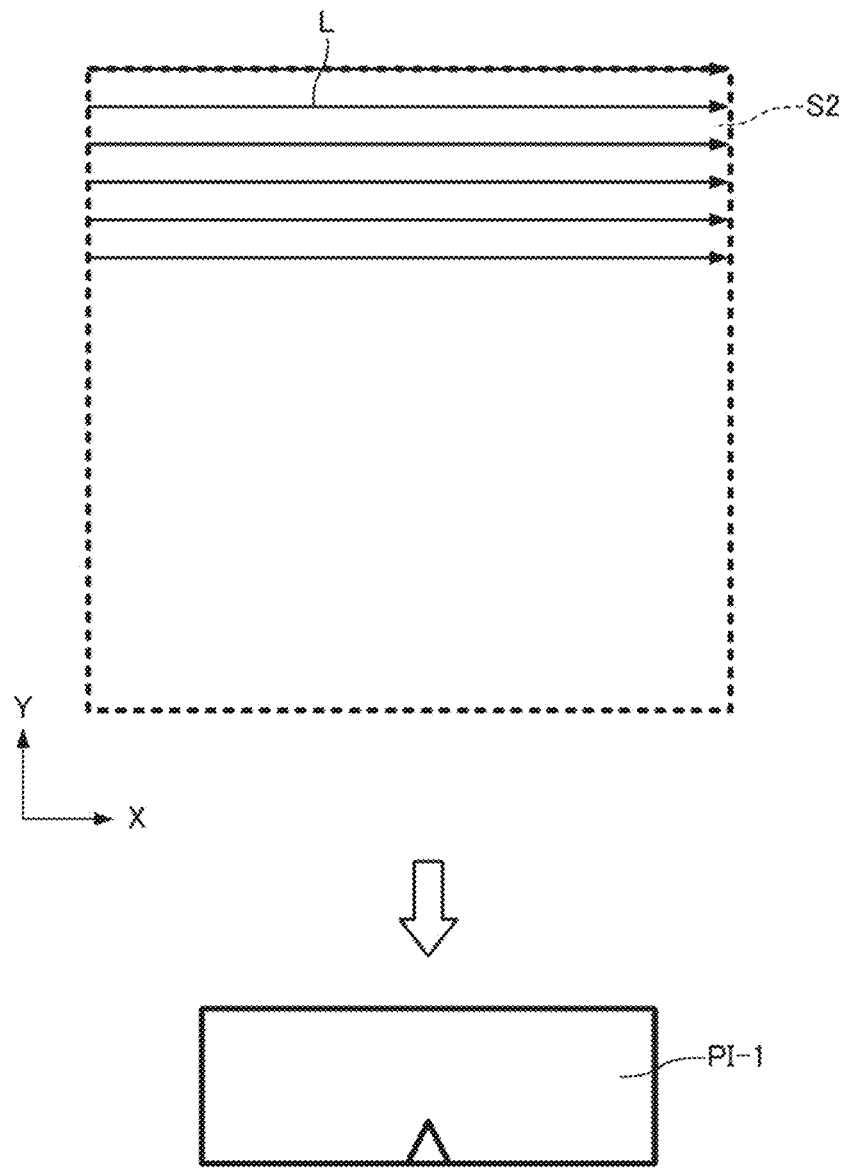
FIG. 11 is a diagram for describing an operation of the Auger electron spectrometer according to the third embodiment.
Figure 12:
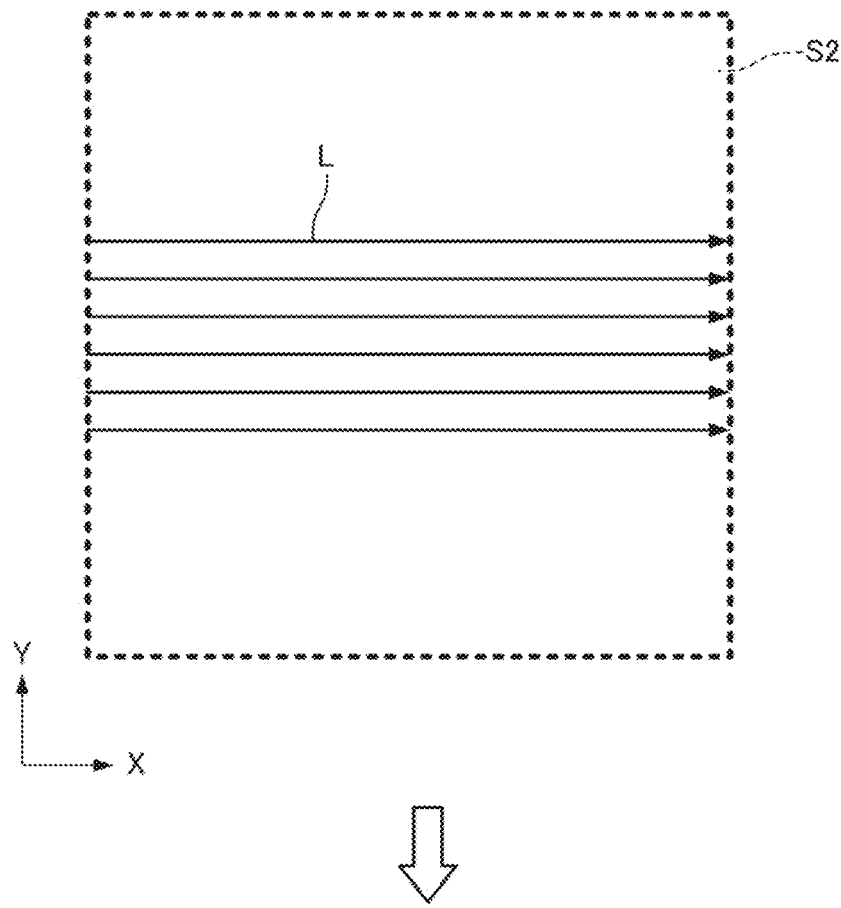
FIG. 12 is a diagram for describing an operation of the Auger electron spectrometer according to the third embodiment.
Figure 12:
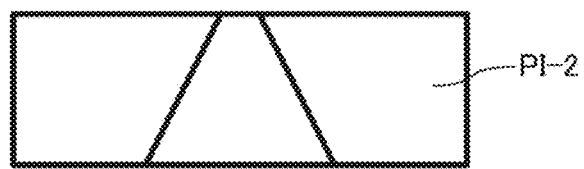
Figure 13:
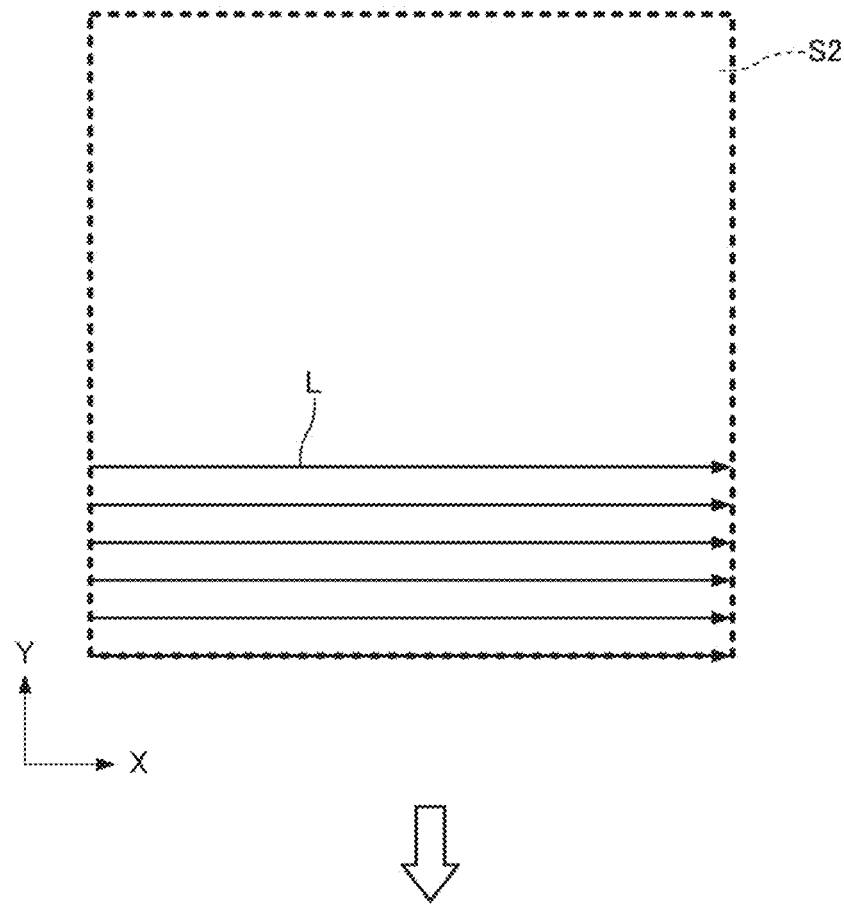
FIG. 13 is a diagram for describing an operation of the Auger electron spectrometer according to the third embodiment.
Figure 13:
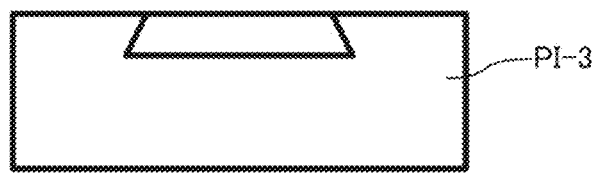

FIG. 10 is a flowchart illustrating an example of the processing performed by the control unit 80 of the Auger electron spectrometer according to the third embodiment. FIGS. 11-13 are diagrams illustrating operations of the Auger electron spectrometer according to the third embodiment. Below, points that differ from the example of the Auger electron spectrometer 100 illustrated in FIG. 3 will be described, while description of similar points will be omitted.

The control unit 80 acquires the base image (S402) after determining that the user has issued a start instruction (Yes in S400).

The processing of S402 for acquiring the base image is performed in a similar manner to the processing of S102 for acquiring the base image, as illustrated in FIG. 3. Note that the base age may be acquired after the observation region S2 has been determined and before the start instruction has been issued.

Next, the control unit 80 performs correction processing for correcting shifting of the irradiation position of the electron probe on the specimen S (S404). The correction processing S404 is performed in a similar manner to the correction processing S104.

Next, as illustrated in FIG. 11, the control unit 80 acquires a partial image PI-1 by causing the optical system 20 to scan the observation region S2 by an amount corresponding to 1/N (where N is an integer of 2 or more) of a frame (S406). In the example illustrated in the figure, the observation region S2 is divided into 3. In other words, in the example illustrated in the figure, N=3. The number of parts into which the observation region S2 is divided may be set as desired. The control unit 80 stores the acquired partial image PI-1 in the storage unit 82.

Next, the control unit 80 determines whether or not partial images have been acquired for 1 frame (S408). In the example illustrated in the figure, the observation region S2 is divided into 3, and therefore the control unit 80 determines that partial images have been acquired for 1 frame when three partial images PI-1, PI-2, and PI-3 have been acquired.

Having determined that partial images have not been acquired for 1 frame (No in S408), the control unit 80 performs the correction processing S404 so as to acquire the partial image PI-2, as illustrated in FIG. 12 (S406). Next, after determining that partial images have not been acquired for 1 frame (No in S408), the control unit 80 performs the correction processing S404 so as to acquire the partial image PI-3, as illustrated in FIG. 13 (S406). Thus, the partial images PI-1, PI-2, and PI-3 corresponding to 1 frame can be acquired. In other words, a single frame image F can be acquired. By performing with the control unit 80 the correction processing S404 for each 1/N of a frame and repeating the processing for acquiring partial images each corresponding to 1/N of a frame N times in this manner, the frame image F is acquired.

After determining that partial images have been acquired for 1 frame (Yes in S408), the control unit 80 determines whether or not the set number of frame images F has been acquired (S410).

Having determined that the set number of frame images F has not been acquired (No in S410), the control unit 80 performs the correction processing S404, the image acquisition processing S406, the determination processing S408, and the determination processing S410. The control unit 80 repeats the correction processing S404, the image acquisition processing S406, the determination processing S408, and the determination processing S410 until it is determined that the set number of frame images F has been acquired.

After determining that the set number of frame images F has been acquired (Yes in S410), the control unit 80 terminates the processing. Thus, a plurality of partial images constituting the set number of frame images F can be acquired. For example, when the number of frame images F is set at 10, 10×N partial images can be acquired.

3.2.2. Processing of Image Processing Unit

The image processing unit 90 generates an image of the specimen S based on the plurality of acquired partial images.

Figure 14:
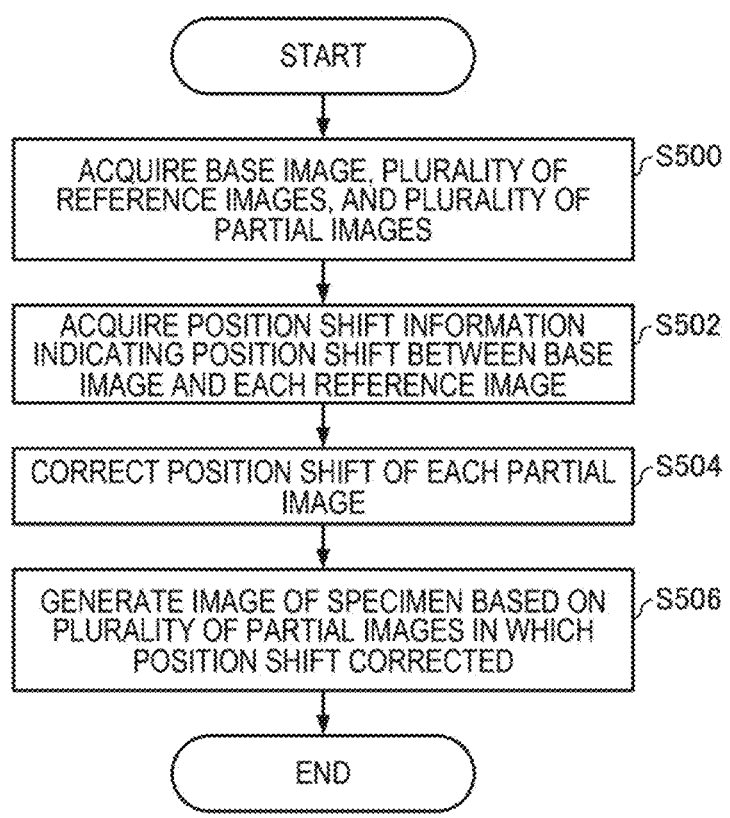
FIG. 14 is a flowchart illustrating an example of processing performed by an image processing unit of the Auger electron spectrometer according to the third embodiment.
Figure 15:
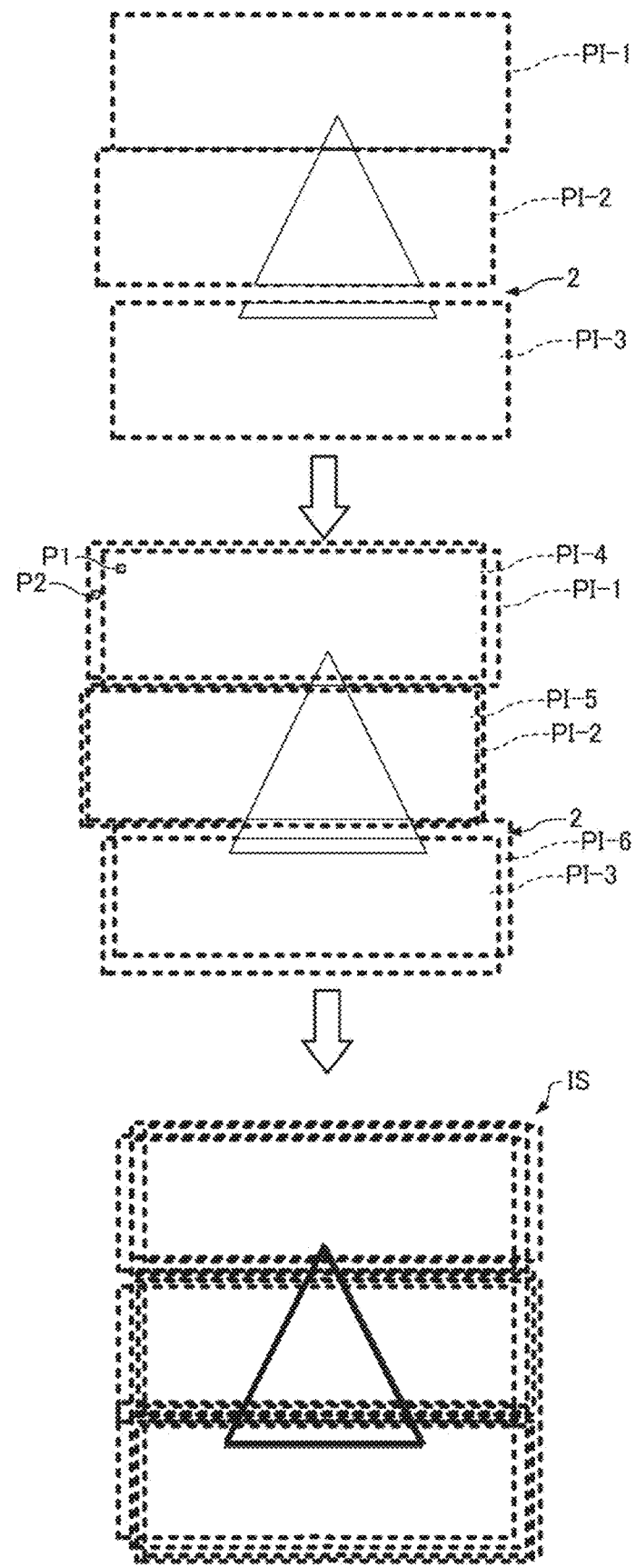
FIG. 15 is a diagram for describing processing performed by the image processing unit of the Auger electron spectrometer according to the third embodiment.

FIG. 14 is a flog chart illustrating an example of the processing performed by the image processing unit 90. FIG. 15 is a diagram for describing the processing performed by the image processing unit 90. Below, points that differ from the example of the Auger electron spectrometer 100 illustrated in FIG. 5 will be described, while description of similar points will be omitted.

First, the image processing unit 90 acquires the base image, a plurality of reference images, and a plurality of partial images by reading the base image, the plurality of reference images, and the plurality of partial images recorded in the storage unit 82 (S500).

Next, the image processing unit 90 acquires position shift information indicating the position shift between the base image and each reference image (S502).

The image processing unit 90 acquires the position shift, information indicating the position shift between the base image and each reference image using similar method to that of the processing of S202 illustrated in FIG. 5 for acquiring the position shift information indicating the position shift between the base image and the reference image.

Next, the image processing unit 90 corrects the position shift of each partial image based on the position shift information indicating the position shift between the base image and each reference image (S504).

As described above, the correction processing S104 is performed for each 1/N of a frame, and therefore a reference image and a partial image are acquired for each 1/N of a frame. Accordingly, the position shift of each partial image is corrected based on position shift information indicating the position shift between the base image and the reference images acquired in the same frame as the partial images.

Next, the image processing unit 90 generates an image (an Auger image) of the specimen S based on the plurality of partial images in which the position shift has been corrected (S506).

For example, the image processing unit 90 superimposes the plurality of partial images, and when two or more pixels exist at the same coordinates, determines the average of the pixel values and sets the result as a pixel value of the image IS of the specimen S. Further, when one pixel exists at the same coordinates, the image processing unit 90 sets the pixel value of that one pixel as a pixel value of the image IS of the specimen S.

As illustrated in FIG. 15, for example, when partial images PI-4, PI-5, and PI-6 acquired in the second frame are superimposed on the partial images PI-1, PI-2, and PI-3 acquired in the first frame, the partial image PI-1 and the partial image PI-4 are superimposed in a position P1 having coordinates (X1, Y1). Accordingly, the pixel value of the pixel at the coordinates (X1, Y1) of the partial image PI-1 and the pixel value of the pixel at the coordinates (X1, Y1) of the partial image PI-4 are averaged, and the result is set as the pixel value of the pixel at the coordinates (X1, Y1) of the image IS. Likewise in a case where three or more partial images are superimposed in a predetermined position, the average of the pixel values of the partial images is set as the pixel value of the corresponding pixel of the image IS.

Furthermore, in a position P2 having coordinates (X2, Y2), the partial image PI-4 exists, and therefore the pixel value of the pixel at the coordinates (X2, Y2) of the partial image PI-4 is set as the pixel value of the pixel at the coordinates (X2, Y2) of the image IS.

Here, in the N partial images constituting one frame image F, pixel values of pixels of the image IS that correspond to a gap 2 between adjacent partial images are determined based on the pixel values of another frame image F.

For example as illustrated in FIG. 15, in the three partial images PI-1, PI-2, and PI-3 constituting the frame image F, the gap 2 exists between the adjacent partial images PI-2 and PI-3. At this time, the partial image PI-6, among the three partial images PI-4, PI-5, and PI-6 constituting another frame image F, overlaps the gap 2. Therefore, the pixel values of the pixels of the partial image PI-6 overlapping the gap 2 are used as the pixel values of the pixels of the image IS that correspond to the region of the gap 2. Thus, blank parts generated in one frame image F when the position shift of the partial images is corrected are compensated for using the pixel values of another frame image F.

In this manner, the image processing unit 90 generates the image IS of the specimen S based on the plurality of partial images in which position shift has been corrected.

3.3. Effects

In the Auger electron spectrometer according to the third embodiment, the control unit 80 performs the correction processing S404 for each 1/N of a frame, and in the image acquisition processing S406, the control unit 80 acquires a partial image by causing the optical system 20 to scan the observation region S2 by an amount corresponding to 1/N of a frame, and acquires each frame image F by repeating the correction processing S404 and the image acquisition processing S406 N times. Thus, in the third embodiment, the correction processing S404 is performed for each 1/N of a frame, and therefore, in comparison with a case where the correction processing is performed for each frame, for example, shifting of the irradiation position of the electron probe can be corrected at shorter time intervals.

In the Auger electron spectrometer according to the third embodiment, the image processing unit 90 corrects the position shift between the partial images based on the position shift information indicating the position shift between the base image and the reference images, and generates the image IS of the specimen S based on the plurality of corrected partial images. Hence, in the third embodiment, shifting of the irradiation position of the electron probe can be corrected at shorter time intervals.

In the Auger electron spectrometer according to the third embodiment, the image processing unit 90 superimposes the plurality of corrected partial images, and when two or more pixels exist at the same coordinates, determines the average of the pixel values and sets the result as a pixel value of the image IS of the specimen S. Further, when one pixel exists at the same coordinates, the image processing unit 90 sets the pixel value of that one pixel as a pixel value of the image IS of the specimen S. Hence, in the third embodiment, the pixel values do not increase in accordance with the number of superimposed partial images, and therefore pixel value differences due to differences in the number of superimposed partial images do not appear on the image IS.

For example, when two or pixels exist at the same coordinates, and the pixel values are integrated and the result is set as a pixel value of the image IS, the pixel value increases as the number of superimposed partial images increases. As a result, pixel value differences corresponding to differences in the number of superimposed partial images appear on the image IS. When two or more pixels exist at the same coordinates and the average of the pixels is determined and set as a pixel value of the image IS of the specimen S, this problem does not occur.

In the Auger electron spectrometer according to the third embodiment, the image processing unit 90 determines the pixel values of the pixels of the image IS of the specimen S that correspond to the gaps 2 between adjacent partial images of the N partial images constituting one of the plurality of frame images F based on the pixel values of another of the plurality of frame images F. Hence, in the third embodiment, when a blank part not having a pixel value occurs in one frame image F constituted by N partial images, the blank part can be compensated for using the pixel values of another frame image F.

4. Modified Examples

Note that the invention is not limited to the embodiments described above, and various other embodiments may be implemented within the scope of the spirit of the invention.

For example, in the first to third embodiments described above, the image IS of the specimen S is generated by integrating or averaging the plurality of acquired frame images after acquiring all of the frame images, but instead, the processing for acquiring the frame images and the image processing for integrating or averaging the frame images may be performed in parallel, and an image of the specimen S may be displayed on a display unit such as a display in real time.

Further, for example, in the first to third embodiments described above, cases in which the charged particle beam device according to the invention is an Auger electron spectrometer were described, but the charged particle beam device according to the invention may be any device that forms a probe from a charged particle beam such as an electron beam or an ion beam and acquires a scanned image by scanning a specimen with the probe. Furthermore, signals generated by the specimen when the specimen is scanned with the probe may be electrons such as secondary electrons, backscattered electrons, or Auger electrons, X-rays such as characteristic X-rays, inelastically scattered electrons, or light such as cathode luminescence.

The charged particle beam device according to the invention may also be, for example, a scanning electron microscope (SEM) a scanning transmission electron microscope (STEM), an electron probe microanalyzer (EPMA), or a secondary ion mass spectrometer (SIMS).

Furthermore, for example, in the first to third embodiments described above, cases in which an Auger image is acquired as the image IS of the specimen S were described, but the charged particle beam device according to the invention may acquire various images of the specimen S other than an Auger image. For example, a secondary electron image, a backscattered electron image, an element map acquired by EDS (energy dispersive X-ray spectroscopy), an element map acquired by WDS (wavelength-dispersive X-ray spectroscopy), or an element map acquired by EELS (electron energy loss spectroscopy) may be acquired as the image of the specimen S.

Moreover, for example, in the first to third embodiments described above, cases in which secondary electron images are used as the base image and the reference image were described, but the base image and the reference image are not limited to secondary electron images, and backscattered electron images, Auger images, element maps acquired by EDS, element maps acquired by EELS, and so on may be used instead.

The invention is not limited to the above-described embodiments, and various modifications can be made. For example, the invention includes configurations that are substantially the same as the configurations described in the embodiments. Substantially same configurations mean configurations having the same functions, methods and results, or configurations having the same objectives and effects as those of the configurations described in the embodiments, for example. The invention also includes configurations obtained by replacing non-essential elements of the configurations described in the embodiments with other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

What is claimed is:

1. A charged particle beam device that acquires an image by scanning a specimen with a probe formed from a charged particle beam and detecting a signal emitted from the specimen, the charged particle beam device comprising:
   an optical system that forms the probe from the charged particle beam and scans the specimen using the probe;
   a control unit that repeatedly performs correction processing for correcting shifting of an irradiation position of the probe on the specimen and image acquisition processing for acquiring a frame image by causing the optical system to scan an observation region of the specimen using the probe; and
   an image processing unit that generates an image of the specimen based on a plurality of the frame images,
   wherein, in the correction processing, the control unit acquires a reference image by causing the optical system to scan the observation region using the probe, and corrects the shifting of the irradiation position of the probe based on a position shift amount between a base image and the reference image, and
   the image processing unit aquires position shift information relating to a position shift between the base image and the reference image, corrects a position shift between the frame images based on the position shift information, and generates the image of the specimen based on the plurality of corrected frame images.

2. The charged particle beam device according to claim 1, wherein
   the control unit performs the correction processing for each 1/N, where N is an integer of 2 or more, of a frame,
   the control unit acquires a partial image in the image acquisition processing by causing the optical system to scan the observation region only by an amount corresponding to 1/N of a frame, and
   the control unit acquires each of the frame images by repeating the correction processing and the image acquisition processing N times.

3. The charged particle beam device according to claim 2, wherein the image processing unit corrects a position shift between the partial images based on the position shift information, and generates an image of the specimen based on the plurality of corrected partial images.

4. The charged particle beam device according to claim 3, wherein
   the image processing unit superimposes the plurality of corrected partial images,
   when two or more pixels exist at identical coordinates, the image processing unit determines an average of pixel values of the two or more pixels and sets the average as a pixel value of the image of the specimen, and
   when one pixel exists at identical coordinates, the image processing unit sets a pixel value of the one pixel as a pixel value of the image of the specimen.

5. The charged particle beam device according to claim 3, wherein the image processing unit determines pixel values of pixels of the image of the specimen that correspond to a gap between adjacent partial images of N partial images constituting one frame image among the plurality of frame images, based on pixel values of another frame image among the plurality of frame images.

6. The charged particle beam device according to claim 1, wherein the reference image and the frame image are the same image.

7. The charged particle beam device according to claim 6, further comprising a detector that detects Auger electrons emitted from the specimen, the Auger electrons having been emitted when the specimen is scanned by the probe, wherein
   the reference image and the frame image are Auger images.

8. The charged particle beam device according to claim 1, further comprising:
   a first detector that detects Auger electrons emitted from the specimen, the Auger electrons having been emitted when the specimen is scanned by the probe; and
   a second detector that detects secondary electrons or backscattered electrons emitted from the specimen, the secondary electrons or back scattered electrons having been emitted when the specimen is scanned by the probe, wherein
   the reference image is a secondary electron image or a backscattered electron image, and
   the frame image is an Auger image.

9. An image acquisition method employed in a charged particle beam device that acquires an image by scanning a specimen with a probe formed from a charged particle beam and detecting a signal emitted from the specimen, the image acquisition method comprising:
   a step for repeatedly performing a correction step for correcting shifting of an irradiation position of the probe on the specimen and an image acquisition step for acquiring a frame image by scanning an observation region of the specimen using the probe; and
   an image processing step for generating an image of the specimen based on a plurality of the frame images,
   wherein, in the correction step, a reference image is acquired by scanning the observation region using the probe, and the shifting of the irradiation position of the probe is corrected based on a position shift amount between a base image and the reference image, and
   in the image processing step, position shift information relating to a position shift between the base image and the reference image is acquired, a position shift between the frame images is corrected based on the position shift information, and the image of the specimen is generated based on the plurality of corrected frame images.

* * * * *